(12) United States Patent
Usui

(10) Patent No.: US 11,127,603 B2
(45) Date of Patent: Sep. 21, 2021

(54) SEMICONDUCTOR MODULE AND POWER CONVERSION DEVICE

(71) Applicant: Mitsubishi Electric Corporation, Tokyo (JP)

(72) Inventor: Osamu Usui, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/605,890

(22) PCT Filed: Sep. 4, 2017

(86) PCT No.: PCT/JP2017/031807
§ 371 (c)(1),
(2) Date: Oct. 17, 2019

(87) PCT Pub. No.: WO2019/043950
PCT Pub. Date: Mar. 7, 2019

(65) Prior Publication Data
US 2020/0343106 A1   Oct. 29, 2020

(51) Int. Cl.
*H01L 21/52* (2006.01)
*H01L 23/48* (2006.01)
(Continued)

(52) U.S. Cl.
CPC ............ *H01L 21/52* (2013.01); *H01L 21/185* (2013.01); *H01L 23/02* (2013.01); *H01L 23/48* (2013.01); *H01L 24/32* (2013.01)

(58) Field of Classification Search
CPC . H01L 23/48; H01L 24/32; H01L 2224/4847; H01L 2224/0603
See application file for complete search history.

(56) References Cited

U.S. PATENT DOCUMENTS 5,942,797 A * 8/1999 Terasawa ............... H01L 25/162
257/703
10,199,312 B1 * 2/2019 Rivera-Marty ... H01L 23/49838
(Continued)

FOREIGN PATENT DOCUMENTS

| JP | S54-071562 A | 6/1979 |
| JP | 2005-101293 A | 4/2005 |
| JP | 2015-005623 A | 1/2015 |

OTHER PUBLICATIONS

International Search Report; Written Opinion; and Notification of Transmittal of the International Search Report and the Written Opinion of the International Searching Authority, or the Declaration issued in PCT/JP2017/031807; dated Nov. 28, 2017.

*Primary Examiner* — Dale E Page
*Assistant Examiner* — Wilner Jean Baptiste
(74) *Attorney, Agent, or Firm* — Studebaker & Brackett PC

(57) ABSTRACT

A semiconductor chip (2) includes a surface electrode (3). A conductive bonding member (8) includes first and second bonding members (8a,8b) provided on the surface electrode (3). A lead electrode (9) is bonded to a part of the surface electrode (3) via the first bonding member (8a) and has no contact with the second bonding member (8b). A signal wire (11) is bonded to the surface electrode (3). The second bonding member (8b) is arranged between the first bonding member (8a) and the signal wire (11). A thickness of the first bonding member (8a) is larger than a thickness of the second bonding member (8b).

23 Claims, 4 Drawing Sheets

(51) Int. Cl.
    *H01L 21/18*     (2006.01)
    *H01L 23/02*     (2006.01)
    *H01L 23/00*     (2006.01)

(56) References Cited

U.S. PATENT DOCUMENTS

| | | | |
|---|---|---|---|
| 2002/0061401 A1* | 5/2002 | Kokubo | H05K 7/1061 |
| | | | 428/403 |
| 2005/0230807 A1* | 10/2005 | Kodani | H01L 24/49 |
| | | | 257/692 |
| 2010/0187678 A1* | 7/2010 | Kajiwara | H01L 23/49524 |
| | | | 257/692 |
| 2013/0071971 A1* | 3/2013 | Kajiwara | H01L 24/32 |
| | | | 438/123 |
| 2014/0374926 A1 | 12/2014 | Miyakawa | |
| 2016/0005703 A1* | 1/2016 | Nakata | H01L 24/73 |
| | | | 257/779 |

* cited by examiner

SEMICONDUCTOR MODULE AND POWER CONVERSION DEVICE

FIELD

The present invention relates to a semiconductor module and a power conversion device.

BACKGROUND

As semiconductor modules am becoming smaller and using increasingly higher current, current density flowing through semiconductor chips and main electrode wiring constituting the semiconductor modules is increasing considerably. For this reason, a DLB (Direct Lead Bonding) structure is used as the main electrode wiring for semiconductor chip surfaces, in which lead electrodes made up of a copper plate or the like am directly bonded to the semiconductor chips by solder or the like.

Furthermore, signal wires are ultrasonically bonded to a gate electrode, an emitter electrode, a current sense electrode, a temperature sense electrode or the like on the semiconductor chip surface. From the standpoints of constraints on or for ease of structures or processes or the like, electric wiring to the semiconductor chip surface is performed by bonding the lead electrode through DLB first and then bonding signal wires. Therefore, the lead electrode needs to be kept a predetermined distance away from a wire bonding region so as to prevent a wire bonding tool for ultrasound-bonding the signal wire from contacting the lead electrode. Thus, the lead electrode is bonded to only a part of the surface electrode.

When a conductive bonding member is provided only at a part bonded to the lead electrode on the surface electrode, current is more likely to flow directly below the lead electrode and current flowing through the semiconductor chip becomes nonuniform. For this reason, breakdown strength at the time of a short circuit decreases and a temperature rise at the semiconductor chip increases. Therefore, a conductive bonding member is also provided at portions having no contact with the lead electrode on the surface electrode (e.g., see PTL 1).

CITATION LIST

Patent Literature

[PTL 1] JP 2005-101293 A

SUMMARY

Technical Problem

When the thickness of the conductive bonding member is small, thermal stress applied to the semiconductor chip and the conductive bonding member increases. If the thickness of the conductive bonding member is increased to prevent the increase in the thermal stress, the wire bonding tool is more likely to contact the conductive bonding member. Both cases result in a problem that reliability of the product deteriorates.

The present invention has been implemented to solve the above-described problem and it is an object of the present invention to provide a semiconductor module and a power conversion device capable of improving reliability of the product.

Solution to Problem

A semiconductor module according to the present invention includes: a semiconductor chip including a surface electrode; a conductive bonding member including first and second bonding members provided on the surface electrode; a lead electrode bonded to a part of the surface electrode via the first bonding member and having no contact with the second bonding member, and a signal wire bonded to the surface electrode, wherein the second bonding member is arranged between the first bonding member and the signal wire, and a thickness of the first bonding member is larger than a thickness of the second bonding member.

Advantageous Effects of Invention

In the present invention, by making the first bonding member that bonds the surface electrode and the lead electrode thicker, it is possible to reduce thermal stress applied to the semiconductor chip and the conductive bonding member. Furthermore, by making the second bonding member arranged near the signal wires thinner, the signal wire can be bonded without the wire bonding tool contacting the conductive bonding member. Reliability of the product can thereby be improved.

DESCRIPTION OF EMBODIMENTS

A semiconductor module and a power conversion device according to the embodiments of the present invention will be described with reference to the drawings. The same components will be denoted by the same symbols, and the repeated description thereof may be omitted.

Embodiment 1

Figure 1:
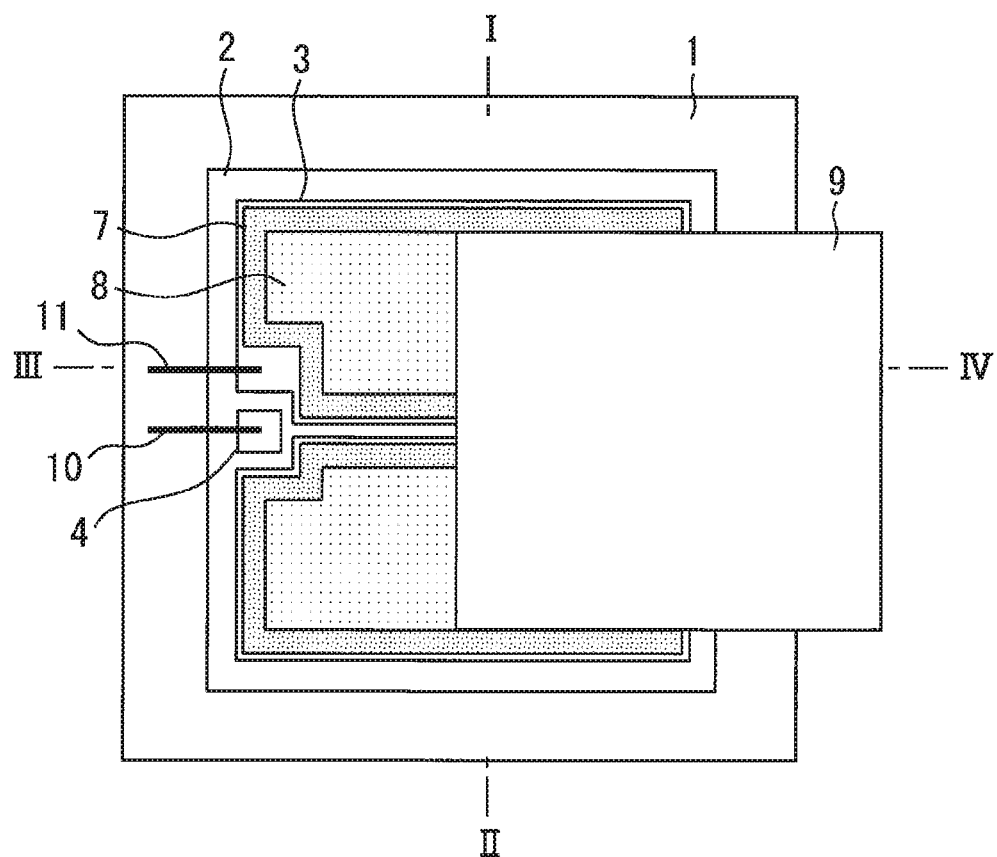
FIG. 1 is a plan view illustrating a semiconductor module according to Embodiment 1.
Figure 2:
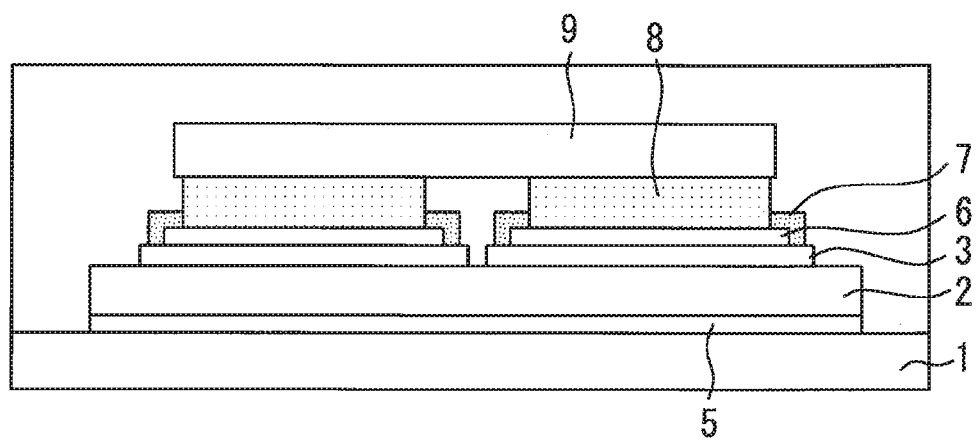
FIG. 2 is a cross-sectional view along a line I-1I in FIG. 1.
Figure 3:
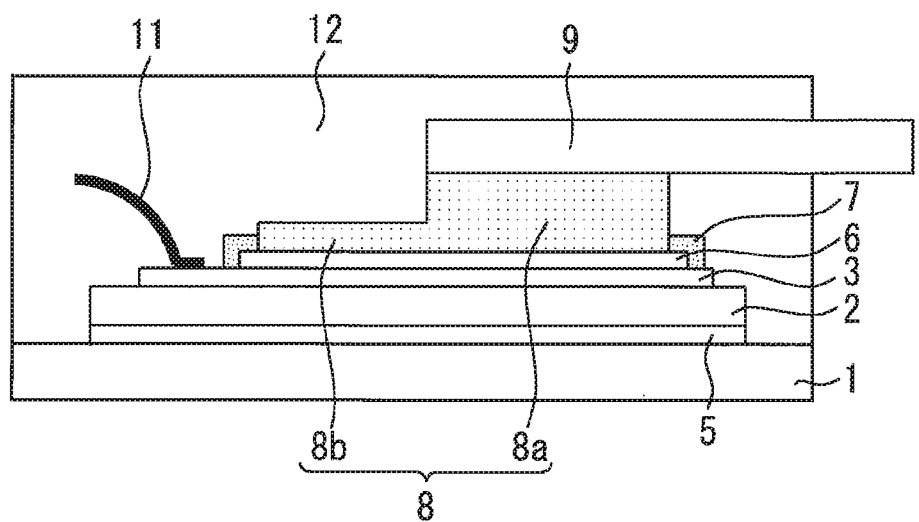
FIG. 3 is a cross-sectional view along a line III-IV in FIG. 1.

FIG. 1 is a plan view illustrating a semiconductor module according to Embodiment 1. FIG. 2 is a cross-sectional view along a line I-II in FIG. 1. FIG. 3 is a cross-sectional view along a line III-IV in FIG. 1. An electrode circuit pattern 1 made of a metal such as copper or aluminum is fixed to an insulating ceramic or resin-based insulating member (not shown). The insulating member is fixed to a base plate (not shown) made of a metal such as copper or aluminum.

A semiconductor chip 2 is provided on the electrode circuit pattern 1. The semiconductor chip 2 is an IGBT (Insulated Gate Bipolar Transistor), which includes an emitter electrode 3 and a gate electrode 4 on a front surface thereof and includes a collector electrode 5 on a back surface thereof. The collector electrode 5 is bonded to the electrode circuit pattern 1 via a bonding member such as solder. However, the semiconductor chip 2 is not limited to the IGBT, but may also be a MOSFET or the like.

A metal film 6 is provided on the whole surface of the emitter electrode 3 except in the vicinity of a wire bonding region and a guard ring. The outer circumference of the metal film 6 is covered with an insulator 7 made of polyimide or the like. A conductive bonding member 8 made of solder or the like is provided on the whole surface of the metal film 6 surrounded by the insulator 7. The conductive bonding member 8 includes first and second bonding members 8a and 8b arranged side by side. A lead electrode 9 made of a metal such as copper is bonded to a part of the emitter electrode 3 via the first bonding member 8a, but it has no contact with the second bonding member 8b.

Signal wires 10 and 11 made of a metal such as aluminum are ultrasonically bonded to the gate electrode 4 and the emitter electrode 3 respectively. The semiconductor chip 2, the conductive bonding member 8, the lead electrode 9 and the signal wires 10 and 11 are sealed with a sealing member 12 such as epoxy resin.

Here, since the lead electrode 9 and the semiconductor chip 2 have different coefficients of linear expansion, thermal stress is generated on the metal film 6 or the conductive bonding member 8 depending on operation of the semiconductor chip 2. Without the insulator 7, the conductive bonding member 8 may extend to an end portion of the metal film 6, thermal stress may apply to the end portion of the metal film 6 via the conductive bonding member 8, causing peeling, increasing the likelihood of cracking and finally causing cracks to advance to the semiconductor chip 2. Thus, by covering the periphery of the metal film 6 with the insulator 7, the conductive bonding member 8 is prevented from extending to the end portion of the metal film 6. This makes it possible to suppress the occurrence of cracking and thereby reduce damage of the emitter electrode 3 of the semiconductor chip 2 caused by thermal stress generated by the operation of the semiconductor module.

The second bonding member 8b is also provided in the portion where the lead electrode 9 is not bonded, and the thickness of the surface electrode of this portion thereby increases, and so electric resistance in the planar direction of the surface electrode decreases. This makes it possible to make the current flowing into the semiconductor chip 2 uniform, and furthermore the increase in the conductive bonding member 8 causes the heat capacity to increase and thereby causes an increase in the breakdown strength of the semiconductor chip 2 at the time of a short circuit and allows the breakdown strength of the semiconductor module to increase. By making the current flowing into the semiconductor chip 2 uniform, it is possible to reduce the temperature of the semiconductor chip 2 at the portion on which current concentrates. Furthermore, the increase of the conductive bonding member 8 causes the heat capacity to increase, and can thereby suppress transitional temperature rise as well.

The second bonding member 8b is arranged between the first bonding member 8a and the signal wire 11, and the lead electrode 9 is arranged at a certain distance from the signal wires 10 and 11. For this reason, the wire bonding tool can ultrasound-bond the signal wires 10 and 11 to predetermined places of the gate electrode 4 and the emitter electrode 3 respectively without contacting the lead electrode 9.

According to the present embodiment, the thickness of the first bonding member 8a is larger than the thickness of the second bonding member 8b. Thus, by making the first bonding member 8a that bonds the emitter electrode 3 and the lead electrode 9 thicker, it is possible to reduce thermal stress applied to the semiconductor chip 2 and the conductive bonding member 8. Furthermore, by making the second bonding member 8 arranged near the signal wires 10 and 11 thinner, the wire bonding tool is less likely to contact the conductive bonding member 8 when the signal wires 10 and 11 are ultrasonically bonded to predetermined places. Reliability of the product can thereby be improved.

Furthermore, the thickness of the first bonding member 8a is preferably 0.3 mm or more and the thickness of the second bonding member 8b is preferably 0.1 mm or more. This makes it possible to increase durability of the conductive bonding member 8 and the semiconductor chip 2 with respect to thermal stress generated through the operation of the semiconductor module and sufficiently secure temperature cycle breakdown strength of the semiconductor module. Furthermore, it is possible to make the current flowing through the semiconductor chip 2 sufficiently uniform and drastically improve current unbalance. Furthermore, the breakdown strength of the semiconductor chip 2 at the time of a short circuit increases, allowing the breakdown strength of the semiconductor module to increase.

Embodiment 2

Figure 4:
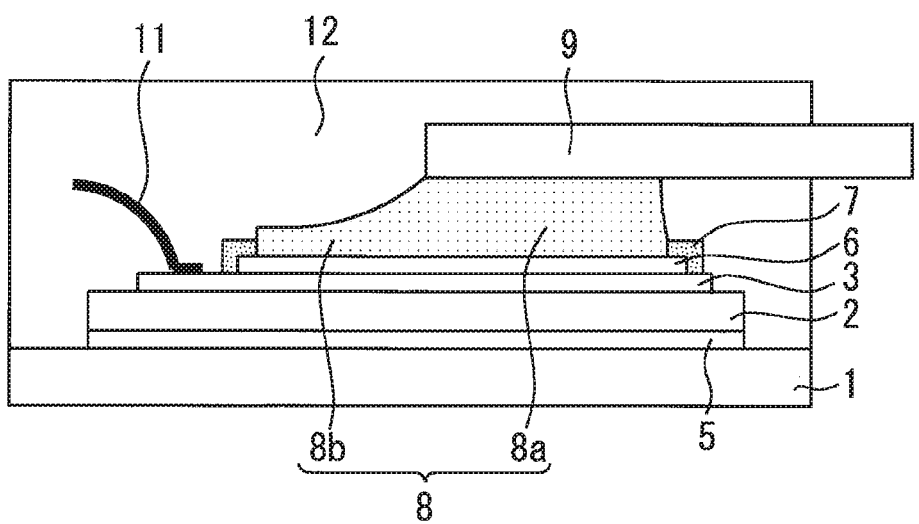
FIG. 4 is a cross-sectional view illustrating a semiconductor module according to Embodiment 2.

FIG. 4 is a cross-sectional view illustrating a semiconductor module according to Embodiment 2. The periphery of the conductive bonding member 8 is formed into a fillet shape. A part of the periphery thereof is the second bonding member 8b. Effects similar to those of Embodiment 1 can be obtained in this case too. The thickness of the first bonding member 8a is preferably 0.3 mm or more and the thickness of the second bonding member 8b is preferably 0.1 mm or more.

Embodiment 3

Figure 5:
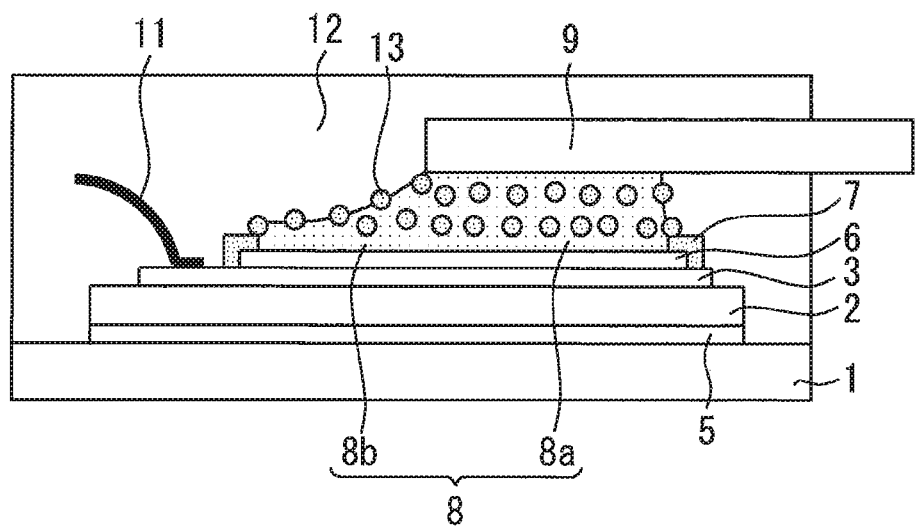
FIG. 5 is a cross-sectional view illustrating a semiconductor module according to Embodiment 3.

FIG. 5 is a cross-sectional view illustrating a semiconductor module according to Embodiment 3. Metallic particles 13 made of nickel or the like are mixed with the conductive bonding member 8. In this way, the conductive bonding member 8 has a rough surface and adhesion between the conductive bonding member 8 and the sealing member 12 is improved by an anchoring effect. It is thereby possible to secure sufficient insulating durability against thermal stress that is repeatedly generated through the operation of the semiconductor module and improve reliability for temperature cycling.

Embodiment 4

Figure 6:
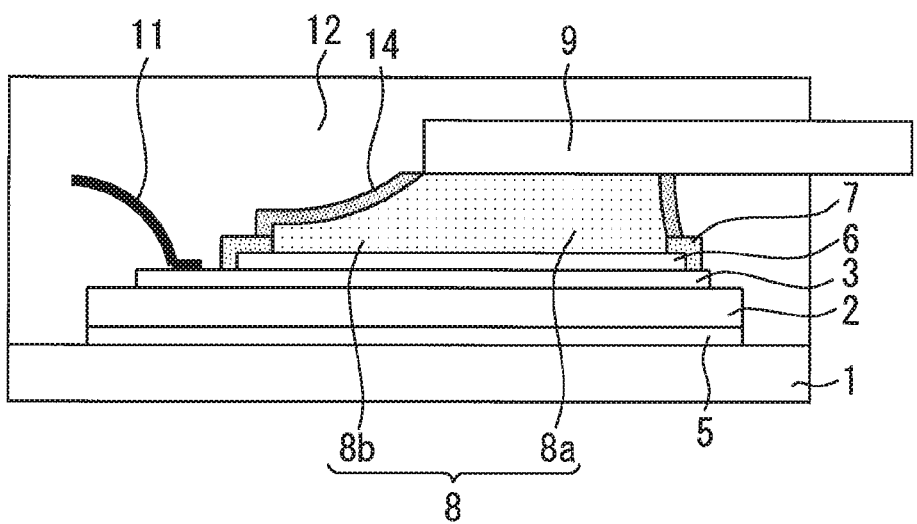
FIG. 6 is a cross-sectional view illustrating a semiconductor module according to Embodiment 4.

FIG. 6 is a cross-sectional view illustrating a semiconductor module according to Embodiment 4. A highly adhesive member 14 made of polyimide or the like is applied to the surface of the conductive bonding member 8. This improves adhesion properties between the conductive bonding member 8 and the sealing member 12. It is thereby possible to secure sufficient insulating durability against thermal stress that is repeatedly generated through the operation of the semiconductor module and improve reliability for temperature cycling. Note that the highly adhesive member 14 may have the same material as the material of the insulator 7, and it is therefore possible to reduce the number of types of materials used and consequently reduce cost.

The semiconductor chip 2 is not limited to a semiconductor chip formed of silicon, but instead may be formed of a wide-bandgap semiconductor having a bandgap wider than that of silicon. The wide-bandgap semiconductor is, for example, a silicon carbide, a gallium-nitride-based material, or diamond. Thereby, even if the on-resistance is small, the current flowing in the semiconductor chip 2 can be equalized by providing the bonding member on the entire surface of the electrode of the semiconductor chip 2. A semiconductor chip 2 formed of such a wide-bandgap semiconductor has a high voltage resistance and a high allowable current density, and thus can be miniaturized. The use of such a miniaturized semiconductor chip 2 enables the miniaturization and high integration of the semiconductor module in which the semiconductor chip 2 is incorporated. Further, since the semiconductor chip 2 has a high heat resistance, a radiation fin of a heatsink can be miniaturized and a water-cooled part can be air-cooled, which leads to further miniaturization of the semiconductor module. Further, since the semiconductor chip 2 has a low power loss and a high efficiency, a highly efficient semiconductor module can be achieved.

Embodiment 5

In this embodiment, the semiconductor module according to any one of Embodiments 1 to 4 described above is applied to an electric power conversion device. The electric power conversion device is, for example, an inverter device, a converter device, a servo amplifier, or a power supply unit. Although the present invention is not limited to a specific electric power conversion device, a case where the present invention is applied to a three-phase inverter will be described below.

Figure 7:
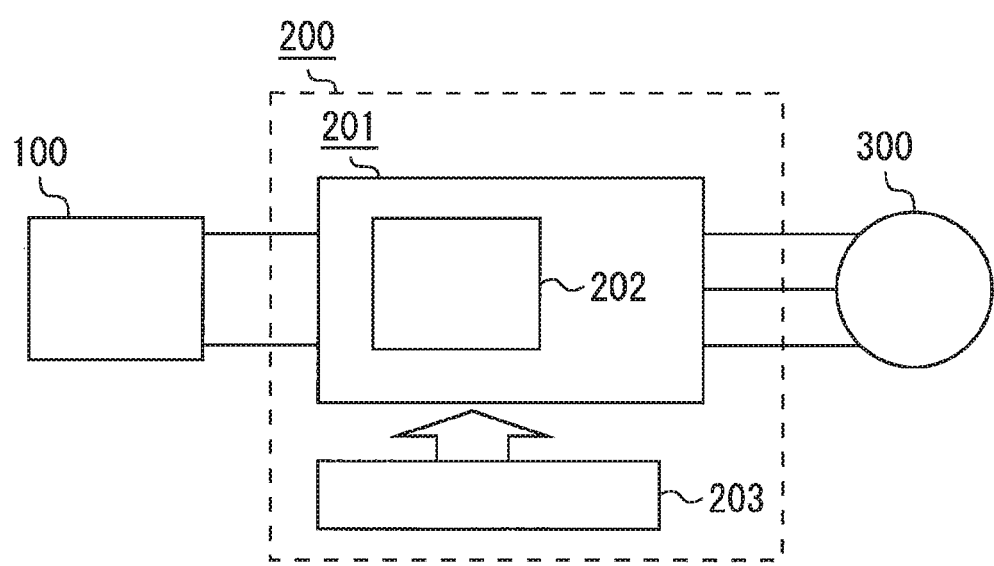
FIG. 7 is a block diagram illustrating a configuration of an electric power conversion system to which the electric power conversion device according to Embodiment 5 is applied.

FIG. 7 is a block diagram illustrating a configuration of an electric power conversion system to which the electric power conversion device according to Embodiment 5 is applied. This electric power conversion system includes a power supply 100, an electric power conversion device 200, and a load 300. The power supply 100 is a DC power supply and supplies DC power to the electric power conversion device 200. The power supply 100 can be composed of various components. For example, the power supply 100 can be composed of a DC system, a solar cell, or a storage battery, or may be composed of a rectifier or an AC/DC converter, which is connected to an AC system. Alternatively, the power supply 100 may be composed of a DC/DC converter that converts DC power output from a DC system to predetermined power.

The electric power conversion device 200 is a three-phase inverter connected to a node between the power supply 100 and the load 300, converts DC power supplied from the power supply 100 into AC power, and supplies the AC power to the load 300. The electric power conversion device 200 includes a main conversion circuit 201 that converts DC power into AC power and outputs the AC power, and a control circuit 203 that outputs a control signal for controlling the main conversion circuit 201 to the main conversion circuit 201.

The load 300 is a three-phase electric motor that is driven by AC power supplied from the electric power conversion device 200. The load 300 is not limited to a specific application. The load is used as an electric motor mounted on various electric devices, such as an electric motor for, for example, a hybrid vehicle, an electric vehicle, a railroad vehicle, an elevator, or an air-conditioner.

The electric power conversion device 200 will be described in detail below. The main conversion circuit 201 includes a switching device and a reflux diode (not illustrated). When the switching device is switched, the main conversion circuit 201 converts DC power supplied from the power supply 100 into AC power, and supplies the AC power to the load 300. The main conversion circuit 201 may have various types of specific circuit configurations. The main conversion circuit 201 according to this embodiment is a two-level three-phase full-bridge circuit, which can be composed of six switching devices and six reflux diodes connected in antiparallel with the respective switching devices. Each switching device and each reflux diode of the main conversion circuit 201 are composed of a semiconductor module 202 corresponding to any one of Embodiments 1 to 4 described above. Every two switching devices of the six switching devices are connected in series and constitute a vertical arm. Each vertical arm constitutes each phase (U-phase, V-phase, W-phase) of the full-bridge circuit. Output terminals of each vertical arm, i.e., three output terminals of the main conversion circuit 201, are connected to the load 300.

Further, the main conversion circuit 201 includes a drive circuit (not illustrated) that drives each switching device. The drive circuit may be incorporated in the semiconductor module 202. Another drive circuit different from the semiconductor module 202 may be provided. The drive circuit generates a drive signal for driving each switching device of the main conversion circuit 201, and supplies the generated drive signal to a control electrode of each switching device of the main conversion circuit 201. Specifically, the drive circuit outputs, to the control electrode of each switching device, a drive signal for turning on each switching device and a drive signal for turning off each switching device, according to the control signal output from the control circuit 203, which is described later. When the ON-state of each switching device is maintained, the drive signal is an ON signal that is a voltage signal having a voltage equal to or higher than a threshold voltage of the switching device. When the OFF-state of each switching device is maintained, the drive signal is an OFF signal that is a voltage signal having a voltage equal to or lower than the threshold voltage of the switching device.

The control circuit 203 controls each switching device of the main conversion circuit 201 so as to supply a desired power to the load 300. Specifically, the control circuit 203 calculates a period (ON period), in which each switching device of the main conversion circuit 201 is in the ON state, based on the power to be supplied to the load 300. For example, the main conversion circuit 201 can be controlled by a PWM control for modulating the ON period of each switching device depending on the voltage to be output. Further, the control circuit 203 outputs a control command (control signal) to the drive circuit included in the main conversion circuit 201 so that the ON signal is output to each switching device to be turned on and an OFF signal is output to each switching device to be turned off at each point. The drive circuit outputs the ON signal or OFF signal, as the drive signal, to the control electrode of each switching device according to the control signal.

In the electric power conversion device according to this embodiment, the semiconductor module according to any one of Embodiments 1 to 4 is applied as the semiconductor module 202, thus reliability of the product can thereby be improved.

While this embodiment illustrates an example in which the present invention is applied to a two-level three-phase inverter, the present invention is not limited to this and can be applied to various electric power conversion devices.

While this embodiment illustrates a two-level electric power conversion device, the present invention can also be applied to a three-level or multi-level electric power conversion device. When power is supplied to a single-phase load, the present invention may be applied to a single-phase inverter. The present invention can also be applied to a DC/DC converter or an AC/DC converter when power is supplied to a DC load or the like.

Further, in the electric power conversion device to which the present invention is applied, the above-mentioned load is not limited to an electric motor. For example, the load may also be used as a power supply device for an electric discharge machine, a laser beam machine, an induction heating cooker, or a non-contact device power feeding system. More alternatively, the electric power conversion device may be used as a power conditioner for a photovoltaic power generating system, an electricity storage system, or the like.

REFERENCE SIGNS LIST 2 semiconductor chip; 3 emitter electrode (surface electrode); 4 gate electrode (surface electrode); 9 lead electrode; 8 conductive bonding member, 8a first bonding member, 8b second bonding member; 10,11 signal wire; 12 sealing member, 13 metallic particle; 14 highly adhesive member, 200 electric power conversion device; 201 main conversion circuit; 202 semiconductor module; 203 control circuit

The invention claimed is:

1. A semiconductor module comprising:
a semiconductor chip including a surface electrode;
a conductive bonding member including first and second bonding members provided on the surface electrode, wherein the first and second bonding members are arranged side by side on the surface electrode in a width direction;
a lead electrode bonded to a part of the surface electrode via the first bonding member and having no contact with the second bonding member; and
a signal wire bonded to the surface electrode,
wherein the second bonding member is arranged between the first bonding member and the signal wire, and
a thickness of the first bonding member is larger than a thickness of the second bonding member in a height direction perpendicular to the width direction.

2. The semiconductor module according to claim 1, wherein the thickness of the first bonding member is 0.3 mm or more, and
the thickness of the second bonding member is 0.1 mm or more.

3. The semiconductor module according to claim 2, further comprising a sealing member sealing the semiconductor chip, the conductive bonding member, the lead electrode and the signal wire,
wherein metallic particles are mixed with the conductive bonding member.

4. The semiconductor module according to claim 3, wherein the semiconductor chip is made of a wide-band-gap semiconductor.

5. A power conversion device comprising:
a main conversion circuit including the semiconductor module according to claim 3, converting input power and outputting converted power; and
a control circuit outputting a control signal for controlling the main conversion circuit to the main conversion circuit.

6. The semiconductor module according to claim 2, further comprising:
a sealing member sealing the semiconductor chip, the conductive bonding member, the lead electrode and the signal wire; and
a highly adhesive member applied to a surface of the conductive bonding member and having higher adhesion to the sealing member than the conductive bonding member.

7. The semiconductor module according to claim 6, wherein the semiconductor chip is made of a wide-band-gap semiconductor.

8. A power conversion device comprising:
a main conversion circuit including the semiconductor module according to claim 6, converting input power and outputting converted power; and
a control circuit outputting a control signal for controlling the main conversion circuit to the main conversion circuit.

9. The semiconductor module according to claim 2, wherein the semiconductor chip is made of a wide-band-gap semiconductor.

10. A power conversion device comprising:
a main conversion circuit including the semiconductor module according to claim 9, converting input power and outputting converted power; and
a control circuit outputting a control signal for controlling the main conversion circuit to the main conversion circuit.

11. A power conversion device comprising:
a main conversion circuit including the semiconductor module according to claim 2, converting input power and outputting converted power; and
a control circuit outputting a control signal for controlling the main conversion circuit to the main conversion circuit.

12. The semiconductor module according to claim 1, further comprising a sealing member sealing the semiconductor chip, the conductive bonding member, the lead electrode and the signal wire,
wherein metallic particles are mixed with the conductive bonding member.

13. The semiconductor module according to claim 12, wherein the semiconductor chip is made of a wide-band-gap semiconductor.

14. A power conversion device comprising:
a main conversion circuit including the semiconductor module according to claim 12, converting input power and outputting converted power; and
a control circuit outputting a control signal for controlling the main conversion circuit to the main conversion circuit.

15. The semiconductor module according to claim 1, further comprising:
a sealing member sealing the semiconductor chip, the conductive bonding member, the lead electrode and the signal wire; and
a highly adhesive member applied to a surface of the conductive bonding member and having higher adhesion to the sealing member than the conductive bonding member.

16. The semiconductor module according to claim 15, wherein the semiconductor chip is made of a wide-band-gap semiconductor.

17. A power conversion device comprising:
a main conversion circuit including the semiconductor module according to claim 15, converting input power and outputting converted power; and
a control circuit outputting a control signal for controlling the main conversion circuit to the main conversion circuit.

18. The semiconductor module according to claim 1, wherein the semiconductor chip is made of a wide-band-gap semiconductor.

19. A power conversion device comprising:
a main conversion circuit including the semiconductor module according to claim 18, converting input power and outputting converted power; and
a control circuit outputting a control signal for controlling the main conversion circuit to the main conversion circuit.

20. A power conversion device comprising:
a main conversion circuit including the semiconductor module according to claim 1, converting input power and outputting converted power; and
a control circuit outputting a control signal for controlling the main conversion circuit to the main conversion circuit.

21. The semiconductor module according to claim 1, further comprising:
a metal film provided on the surface electrode, wherein
wherein the conductive bonding member is provided on the metal film, and
the lead electrode is bonded to a part of the metal film.

22. The semiconductor module according to claim 1, wherein the first bonding member and the second bonding member are made of a same material.

23. The semiconductor module according to claim 1, wherein the first bonding member and the second bonding member are solder.

* * * * *